United States Patent [19]
Dadali et al.

[11] Patent Number: 5,578,814
[45] Date of Patent: Nov. 26, 1996

[54] SENSOR DEVICE FOR STORING ELECTROMAGNETIC RADIATION AND FOR TRANSFORMING SUCH INTO ELECTRIC SIGNALS

[75] Inventors: Alexander A. Dadali, Bayonne, N.J.; Aleksandr M. Fomin, St. Halturina, Russian Federation

[73] Assignee: Intronix, Inc., Hackensack, N.J.

[21] Appl. No.: 449,307

[22] Filed: May 24, 1995

Related U.S. Application Data

[63] Continuation-in-part of Ser. No. 128,796, Sep. 29, 1993, Pat. No. 5,428,216.

[51] Int. Cl.⁶ .................................... H01J 40/14
[52] U.S. Cl. .................. 250/208.1; 257/291; 250/214.1
[58] Field of Search ............... 250/208.1, 214.1; 257/59, 72, 291

[56] References Cited

U.S. PATENT DOCUMENTS

| | | |
|---|---|---|
| 3,497,698 | 2/1970 | Phelan et al. . |
| 3,512,041 | 5/1970 | Dalmasso . |
| 4,354,104 | 10/1982 | Chikamura et al. . |
| 4,672,454 | 6/1987 | Cannella et al. . |
| 4,878,120 | 10/1989 | Matsumoto et al. ............... 257/291 |
| 4,889,983 | 12/1989 | Numano et al. ................ 250/208.1 |
| 4,916,304 | 4/1990 | Itabashi et al. ................ 250/214.1 |
| 4,931,661 | 6/1990 | Fukaya et al. ................. 250/208.1 |
| 5,066,861 | 11/1991 | Nakayama et al. . |
| 5,117,114 | 5/1992 | Street et al. . |
| 5,182,624 | 1/1993 | Tran et al. . |
| 5,276,329 | 1/1994 | Hughes . |
| 5,319,206 | 6/1994 | Lee et al. . |
| 5,428,216 | 6/1995 | Fomin et al. ..................... 257/291 |

*Primary Examiner*—Stephone Allen
*Attorney, Agent, or Firm*—Klauber & Jackson

[57] ABSTRACT

A sensor device which allows significant reductions in structural dimensions while maintaining sensitivity over a wide operating range. The sensor device comprises a plurality of integral layers formed over a typical field effect transistor. This plurality of integral layers includes a first additional electrode, a dielectric layer, a conducting layer, a second additional electrode, an active medium, a transparent electrode, and a layer of luminofore.

19 Claims, 13 Drawing Sheets

SENSOR DEVICE FOR STORING ELECTROMAGNETIC RADIATION AND FOR TRANSFORMING SUCH INTO ELECTRIC SIGNALS

CROSS-REFERENCE TO RELATED APPLICATIONS

This application is a continuation-in-part application of U.S. patent application Ser. No. 08/128,796 filed on Sep. 29, 1993, now U.S. Pat. No. 5,428,216, patented June 1995.

FIELD OF THE INVENTION

The present invention relates to sensor devices and, more particularly, to a sensor device for storing electromagnetic radiation and for transforming electromagnetic radiation into electrical/video signals.

DESCRIPTION OF THE PRIOR ART

Various sensor devices exist for storing electromagnetic radiation and for transforming electromagnetic radiation into electrical/video signals. However many of these sensor devices have serious drawbacks which limit their applications. The most significant of these drawbacks is the inability to maintain the sensitivity of the sensor devices while reducing their structural dimensions. The significance of this drawback is ever increasing due to the increasing desire to provide more and more sensing capability from within a constant amount of allowable area.

A related drawback is the inability to maintain a wide operating range as the structural dimensions of the sensor devices are reduced. The significance of this drawback is also increasing due to the increasing desire to utilize and operate in more and more of the electromagnetic spectrum.

Several patents have been issued for sensor devices attempting to address the drawbacks just described. For example, U.S. Pat. Nos. 5,117,114 to Street et al., 5,182,624 to Tran et al., 5,066,861 to Nakayama et al., 5,276,329 to Hughes, 4,354,104 to Chikamura et al., 5,319,206 to Lee et al., 4,672,454 to Cannella et al., 3,497,698 to Phelan et al., and 3,512,041 to Dalmasso are all directed toward sensor devices which operate over a particular range of the electromagnetic spectrum. A brief description of these patents will now be given.

In U.S. Pat. No. 5,117,114, Street et al. disclose a radiation detector comprising a substrate, an electronics readout layer formed on the substrate, a first electrode layer formed on the electronics readout layer, a semiconductor layer including a hydrogenated amorphous silicon film formed on the first electrode layer, a second electrode layer formed on the semiconductor layer, and a energy converter or scintillator layer formed on the second electrode layer. The radiation detector operates as follows. A voltage bias is applied between the first and second electrode layers so as to reduce recombination in the semiconductor layer. Radiation that is incident upon the energy converter or scintillator layer is converted to light energy which propagates through the second electrode layer and into the semiconductor layer. The light energy in the semiconductor layer results in photoelectron production, thereby producing electrons or electron-hole pairs which produce a detectable current. This current is detected by a readout device in the electronics readout layer.

In U.S. Pat. No. 5,182,624, Tran et al. disclose a solid state detector comprising a substrate, an array of field effect transistors (FET's) formed on the substrate, a planarization layer formed over the array of FET's, an energy sensitive layer formed over the planarization layer, and a top electrode layer formed over the energy sensitive layer. The solid state detector operates as follows. A power source is used to apply a charge to the energy sensitive layer. Incident radiation causes a change in the charge in the energy sensitive layer. The change in the charge in the energy sensitive layer causes the gate voltage of the FET's to change which is detected as a change in the drain-source current of the FET's.

In U.S. Pat. No. 5,066,861, Nakayama et al. disclose an X-ray detecting device comprising a substrate, a metal electrode formed on the substrate, a light-to-electrical (LE) converting layer formed over the metal electrode, a transparent electrical conducting layer formed over the LE converting layer, and an X-ray-to-light (XL) converting layer formed over the transparent electrical conducting layer. The X-ray detecting device operates by allowing X-rays to be projected onto the XL converting layer. The XL converting layer converts the X-rays into visible light which is projected, through the transparent electrical conducting layer, onto the LE converting layer. The LE converting layer, in response to the impinging visible light, generates a voltage between the metal electrode and the transparent electrical conducting layer. This voltage is then measured so as to provide an indication of the intensity of the X-rays.

In U.S. Pat. No. 5,276,329, Hughes discloses an image detector comprising a first substrate having an electromagnetic radiation conversion layer formed thereon, a second substrate having a photodetector array formed thereon, and a mounting means for securing the first substrate to the second substrate with an insulative space separating the electromagnetic radiation conversion layer and the photodetector array. The image detector operates by allowing electromagnetic radiation within a first range of wavelengths to be projected upon the first substrate, which allows this electromagnetic radiation to pass therethrough and on to the electromagnetic radiation conversion layer. The electromagnetic radiation conversion layer converts the electromagnetic radiation within the first range of wavelengths into electromagnetic radiation within a second range of wavelengths. This electromagnetic radiation is detected by the photodetector array and converted into an electrical signal representative of the intensity of the incident electromagnetic radiation.

In U.S. Pat. No. 4,354,104, Chikamura et al. discloses a solid state image pickup device comprising a substrate, source and drain regions formed in the substrate, an insulating layer formed over the source and drain regions, a gate formed within the insulating layer, a first electrode formed over the insulating layer but in contact with the source region, a hole blocking layer formed over the electrode, a photoconducting layer formed over the hole blocking layer, a transparent electrode formed over the photoconducting layer, and a light shielding layer formed over the transparent electrode. The solid state image pickup device operates by allowing the light shielding layer to optically shield the spacing between the first electrode and a first electrode of an adjacent device.

In U.S. Pat. No. 5,319,206, Lee et al. disclose an X-ray image capture element comprising a dielectric substrate upon which a transistor and a charge storage capacitor are formed, a charge blocking cover layer formed over the charge storage capacitor, a photoconductive layer formed over the transistor and the charge storage capacitor with the charge blocking cover layer, a dielectric layer formed over the photoconductive layer, and a transparent conductive layer formed over the dielectric layer. The X-ray image capture element operates by allowing X-ray radiation to impinge upon the photoconductive layer, thereby generating excess electron-hole pairs within the photoconductive layer. Consequently, positive charges accumulate across the charge storage capacitor which changes the voltage at a corresponding transistor electrode.

In U.S. Pat. No. 4,672,454, Cannella et al. disclose an apparatus for providing electrical signals representative of an image formed by X-rays projected thereon comprising a substrate, a light sensitive element formed on the substrate, a transparent conductor formed over the light sensitive element, a multilayer energy converter formed over the transparent conductor, and a transparent cover formed over the multilayer energy converter. The apparatus operates by allowing an X-ray image to be projected onto and through the transparent cover and into the multilayer energy converter. The multilayer energy converter converts the X-ray energy to light energy which is projected onto and through the transparent conductor and into the light sensitive element. The light sensitive element converts the light energy to a sensible electrical characteristic.

In U.S. Pat. No. 3,497,698, Phelan et al. disclose a radiation detector comprising a conductive base, a semiconductor body having a depletion region formed therein formed on the conductive base, an insulator layer formed over the semiconductor body, and a transparent conductive film formed over the insulator layer. The radiation detector operates by allowing radiation to be projected onto and through both the transparent conductive film and the insulator layer and into the semiconductor body. The radiation produces electron-hole pairs in the depletion region which can be measured to yield a measure of the intensity of the radiation.

In U.S. Pat. No. 3,512,041, Dalmasso discloses an electroluminescent display for the visual display of information.

Although all of the above-mentioned patents are directed toward sensor devices which operate over a particular range of the electromagnetic spectrum, none are directed toward a sensor device which allows significant reductions in structural dimensions while maintaining sensitivity over a wide operating range.

SUMMARY OF THE INVENTION

The present invention contemplates a sensor device which allows significant reductions in structural dimensions while maintaining sensitivity over a wide operating range. The sensor device comprises a plurality of integral layers formed over a typical field effect transistor. This plurality of integral layers includes a first additional electrode, a dielectric layer, a conducting layer, a second additional electrode, an active medium, a transparent electrode, and a layer of luminofore.

The layer of luminofore transforms electromagnetic radiation in the X-ray range into visible light. A voltage differential is applied across the active medium via electrical connections made from an external voltage supply to the transparent electrode and the conducting layer. The voltage differential applied across the active medium results in an electric field being created in the active medium which, due to the structure of the second additional electrode, is a non-homogeneous, high gradient electric field. This non-homogeneous, high gradient electric field produces a space charge distribution in the active medium.

The active medium, which is either partially or entirely formed of photoconducting material, is also the site of photogeneration due to any visible light created by the layer of luminofore. This photogeneration creates a space charge redistribution in the active medium which is most active near the upper tip of the first additional conducting electrode. The space charge redistribution is transferred to the gate of the field effect transistor by the first additional conducting electrode, thereby changing the conductivity of the channel of the field effect transistor. The change in the conductivity of the channel of the field effect transistor is sensed at the output of the sensor device through the source and drain of the field effect transistor.

The first additional conducting electrode, which is insulated by the dielectric layer from the active medium everywhere except at its uppermost tip, has an elongated shape which is critical to reducing the structural dimensions of the sensor device. The sensitivity and the dynamic range of the sensor device is determined by the voltage differential is applied across the active medium.

From the above descriptive summary it is apparent how the present invention sensor device overcomes the shortcomings of existing sensor devices.

Accordingly, the primary objective of the present invention is to provide a sensor device which allows significant reductions in structural dimensions while maintaining sensitivity over a wide operating range.

Other objectives and advantages of the present invention will become apparent to those skilled in the art upon reading the following detailed description and claims, in conjunction with the accompanying drawings which are appended hereto.

BRIEF DESCRIPTION OF THE DRAWINGS

In order to facilitate a fuller understanding of the present invention movable hand sign, reference is now made to the appended drawings. The drawings should not be construed as limiting the present invention, but are intended to be exemplary only.

PREFERRED EMBODIMENT OF THE PRESENT INVENTION

Figure 1:
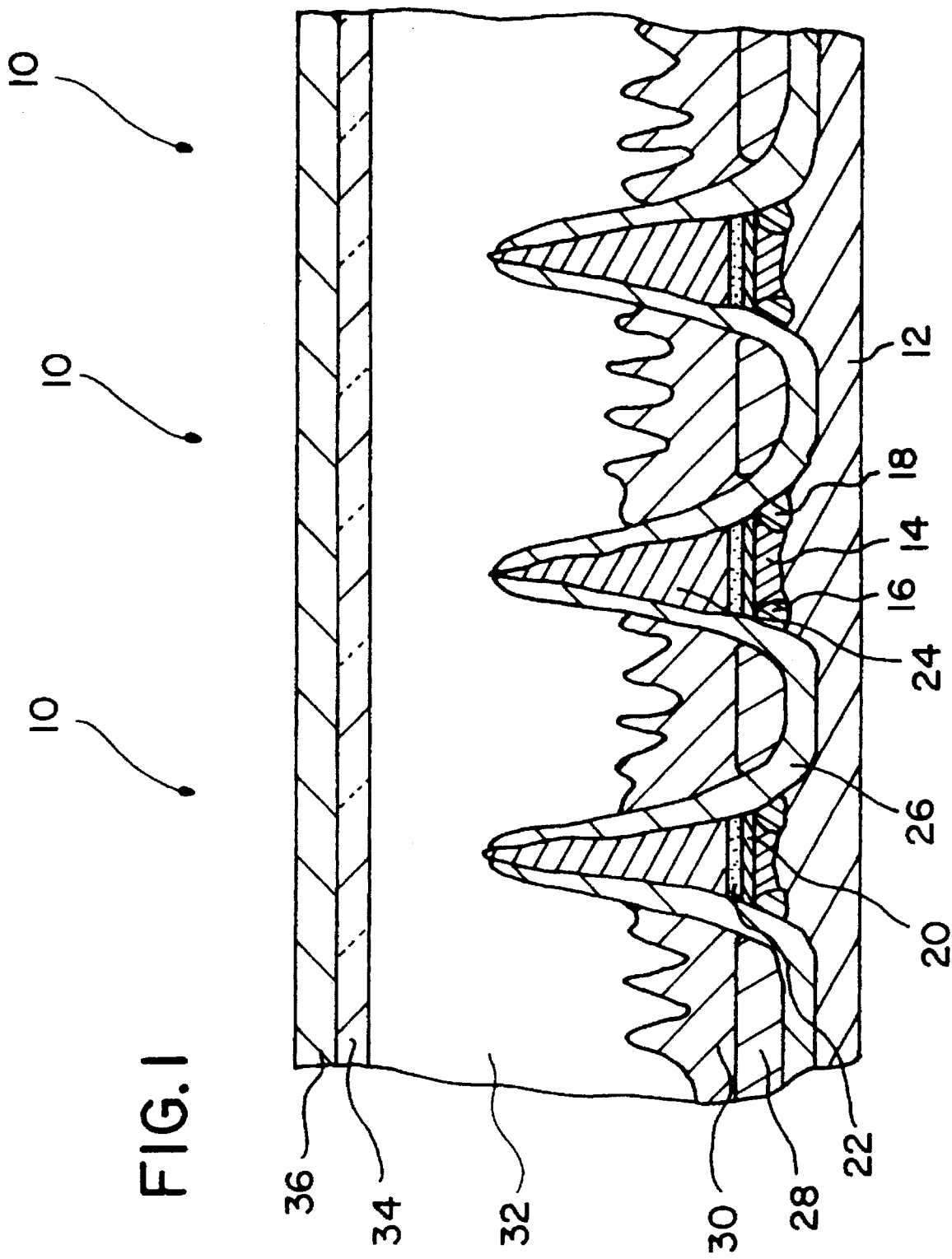
FIG. 1 is a cross-sectional view of a several sensor devices according to the present invention.

Referring to FIG. 1, there is shown a cross-sectional view of several sensor devices 10 according to the present invention. Each sensor device 10 comprises a typical field effect transistor having a substrate 12, a channel 14, a source 16, a drain 18, a gate insulator 20, and a gate 22. Each sensor device 10 also comprises a plurality of layers formed over the field effect transistor. This plurality of layers comprises a first additional electrode 24, a dielectric layer 26, a conducting layer 28, a second additional electrode 30, an active medium 32, a transparent electrode 34, and a layer of luminofore 36.

The first additional electrode 24 is formed over and is electrically connected to the gate 22. The first additional electrode 24 is formed with materials having high conductivity ($\sigma > 10^{-8}$ ohm$^{-1}$ cm$^{-1}$) such as the metals Al, Au, Cu, or In. The first additional electrode 24 may also be formed with high conductivity semiconductor materials such as crystalline selenium (Se) or chalcogenic glass in its conducting state. The first additional electrode 24 extends well up into the active medium 32 so as to interact with the active medium 32 as will be described in detail shortly.

The dielectric layer 26 is formed over substantially all of the field effect transistor and the first additional electrode 24. The tip of the first additional electrode 24 is shown not covered by the dielectric layer 26 so as to allow the first additional electrode 24 to directly interact with the active medium 32 as will be described in detail shortly. The dielectric layer 26, which is formed with typical dielectric materials, should have a low conductivity ($\sigma \approx 10^{-13}$ ohm$^{-1}$). It should be noted that the dielectric layer 26 may completely cover the first additional electrode 24 so that the interaction between the first additional electrode 24 and the active medium 32 is capacitive in nature (see FIG. 2).

The conducting layer 28 is formed over a lower portion of the dielectric layer 26. Thus, the conducting layer 28 is not in contact with or covering the tip of the first additional electrode 24. However, similar to the first additional electrode 24, the conducting layer 28 is formed with materials having high conductivity ($\sigma > 10^{-8}$ ohm$^{-1}$ cm$^{-1}$) such as the metals Al, Cu, Ni, or In. In operation, the conducting layer 28 is connected to an external power supply so as to bias the active medium 32 through the second additional electrode 30 as will be described in detail shortly.

The second additional electrode 30 is formed over and is electrically connected to the conducting layer 28, and is formed over a lower portion of the dielectric layer 26. Thus, the second additional electrode 30 is not in contact with or covering the tip of the first additional electrode 24. The second additional electrode 30 is formed with materials having a conductivity much less than the conductivity of the conducting layer 28, but much greater than the conductivity of the dielectric layer 26. Thus, the second additional electrode 30 is formed with materials having a conductivity within the range of $10^{-13} << \sigma << 10^{-8}$ ohm$^{-1}$ cm$^{-1}$. A listing of some of the materials from which the second additional electrode 30 is formed includes chalcogenic glass (in its low conducting state), amorphous selenium, dielectrics with dopants, some organic compounds such as thermo- and chemically-treated polymers, and metal oxides.

The active medium 32 is formed over the conducting layer 28, the dielectric layer 26, and the first additional electrode 24. Thus, the tip of the first additional electrode 24 is in contact with the active medium 32. The active medium 32 either may be fabricated entirely of a photo-conducting material or may be fabricated of multiple layers of which one, a photo-conducting layer, is fabricated of a photo-conducting material (see FIG. 3). The photo-conducting material may be either an organic or inorganic photoconductor. A listing of some of the possible photoconducting materials includes selenium (Se), compounds of lead (particularly PbO), CdSe, and CdS. The photoconducting material may also be a piroelectric material, for example turmaline (aluminum silicate) in monocrystal form.

In the case of a multilayer active medium, the additional layers may include at least one layer of dielectric, for example $Al_2O_3$ (aluminum oxide), $SiO_2$, nitrides of aluminum, silicon, titanium, and some organic compounds such as polymeric dielectrics (poly-isoprene, poly-vinyl-carbazole, poly-epoxy-propyl-carbazole). The active medium 32 may also comprise a layer of a ferro-electric material (for example, barium titanate, $BaTiO_3$). It should be noted that ferro-electric material may also be included in the first additional electrode 24 as well as in the second additional electrode 30.

The transparent electrode 34 is formed over the active medium 32. The transparent electrode 34 is very thin so as to be transparent and is formed with materials having very high conductivity. Typically, the transparent electrode 34 is formed with a very thin film, for example, with a thin layer of gold (500–5000 Å). In operation, the transparent electrode 34 is connected to an external power supply so as to bias the active medium 32 as will be described in detail shortly.

The layer of luminofore 36 is formed over the transparent electrode 34. The layer of luminofore 36 may be formed with typical compounds such as ZnS or ZnSe with mixtures of rare-earth metals and with anthracene as a scintillator. It should be noted that luminofore and/or scintillator may also be included in the photo-conducting layer of the active medium 32 as hetero-phase and/or homo-phase structures.

The field-effect transistor, having substrate 12, channel 14, source 16, drain 18, gate insulator 20, and gate 22, may be formed according to standard semiconductor manufacturing practices, except of course on a smaller scale due to the benefits of the present invention. The field effect transistor may be formed with the gate 22 electrically insulated from the channel 14 by a reverse-shifted pn-junction, as well as with a thin dielectric layer 20, as shown. Within the substrate 12, there are electrical bus-bars 38 (see FIG. 4) which are connected to the sources 16 and drains 18 of each sensor device 10 so as to provide output connections from each sensor device 10. The bus-bars 38 may be formed with good conducting materials, such as the metals Al, Ni, and Cu.

Space distributions in the active medium 32 due to a voltage potential applied across and an electrical current propagating within the active medium 32 are formed from a distribution of a density of charges in the active medium 32. These charges can be in two states: 1.) a free state wherein the charges participate in a charge transfer process, i.e. electrical current; and 2.) a state wherein the charges are trapped by trapping levels creating in the volume of the active medium 32 a space distributed charge.

Photogeneration occurs at high and/or at short wave radiation of the sensor device 10. Such photogeneration provokes a local change of the potential in the volume of the active medium 32. A potential relief appearing in the volume of the active medium 32 has a height (a magnitude of the potential) defined by an intensity of the radiation in the layer of luminofore 36.

The potential relief is detected by the first additional electrode 24, which is connected both electrically and physically with the gate 22. This first additional electrode 24 is formed as a three-dimensional structure. The height of this structure is comparable with the thickness of the active medium 32, but is of less thickness. Thus, the tip of this electrode 24 is sensitive to the magnitude of the potential distributed in the immediate proximity of the tip. The value of this magnitude is transmitted to the gate 22.

The first additional electrode 24 is coated with the layer of dielectric 26. This dielectric layer 26 insulates the first additional electrode 24 against both the active medium 32 and against the components of the active medium 32. Thus, the non-insulated tip acts as a sensor for the first additional electrode 24. In this case the first additional electrode 24 transfers to the gate 22 the value of the potential distributed near of the tip of the first additional electrode 24.

The dimensions of the non-insulated tip portion of the first additional electrode 24 are much less than the dimensions of the base portion of the first additional electrode 24, which is of comparable order to that of the area of the gate 22.

The linear dimension of the gate 22 is typically less than or equal to 3 microns (<3 microns). Therefore, the dimensions of the tip portion of the first additional electrode 24 is typically less than or equal to 1 micron. This is the main reason for the miniaturization of the present invention device, and for the obtaining of a high relative resolution for a matrix of these devices.

The height of the tip portion of the first additional electrode 24 is less than the thickness of the active medium 32. Thus, the tip portion of the first additional electrode 24 is located in relative proximity to surface of the active medium 32 near the transparent electrode 34.

Figure 4:
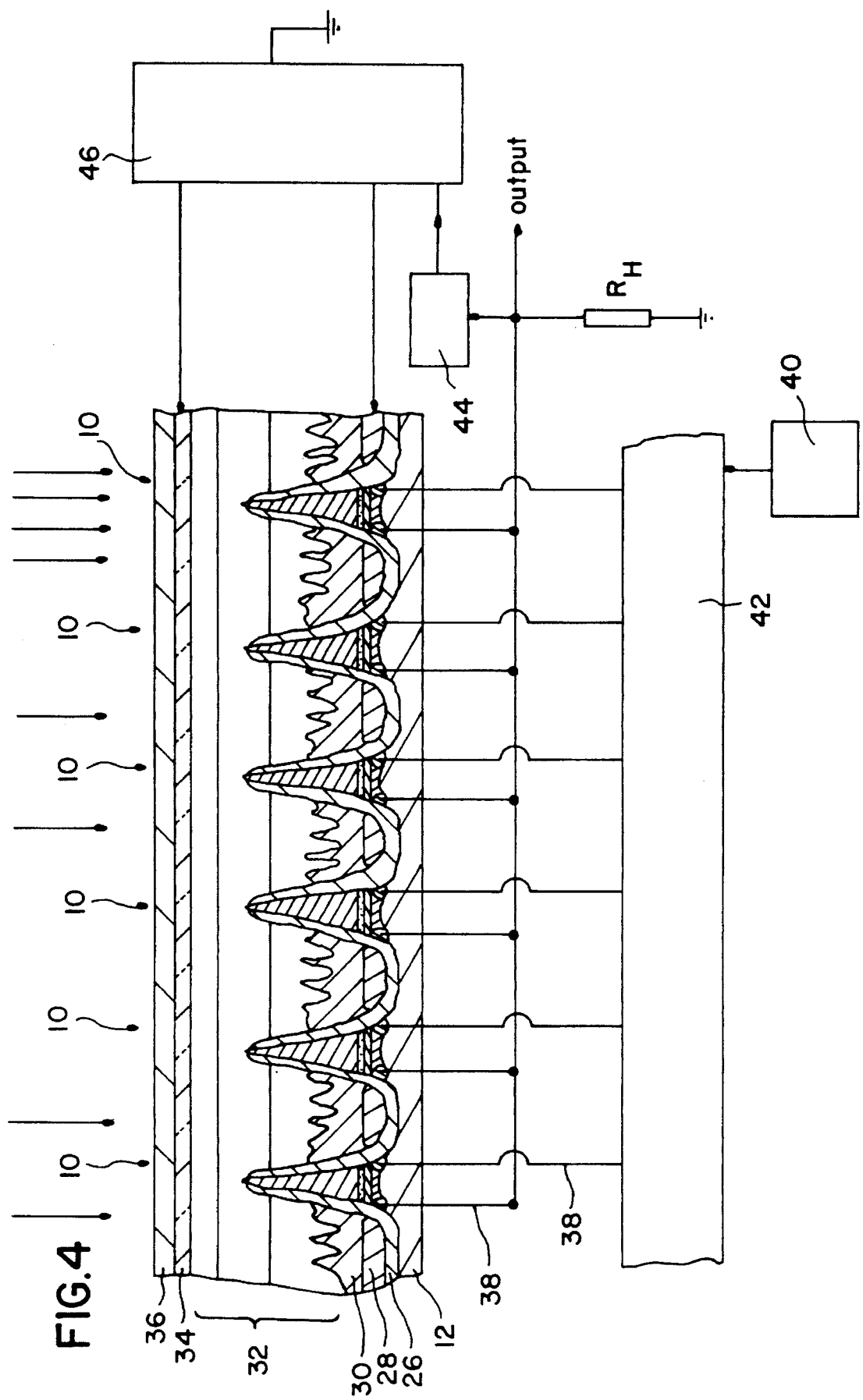
FIG. 4 is a schematic diagram showing several sensor devices according to the present invention electrically connected to external circuitry.

Referring to FIG. 4, several present invention sensor devices 10 are shown connected to a generator 40, a scanning device 42, a feed-back circuit 44, and voltage power supply 46. The scanning device 42 and the feedback circuit 44 are connected to the sources 16 and drains 18 of the sensor devices 10 through the bus-bars 38. The voltage power supply 46 is connected to the transparent electrode 34 and the conducting layer 28. The voltage power supply 46 is also connected to the feed-back circuit 44 for reasons which will be discussed below. These components are external to the sensor devices 10 and various constructive realizations of these components are possible. For instance, the generator 40 may be connected with the scanning device 42 either by wires or by a wireless system of communication using either radio, infra-red, ultra-sound, or fiber-optic kinds of communications. In each of these cases a corresponding transmitting-receiving system must be used.

The scanning device 42 can be used both as a ring counter (mostly for linear, one-dimensional matrices) and as a shift-register (mostly for two-dimensional matrices).

The conductivity of each channel 14 is measured by the scanning device 42 by commutation in circuits including the bus-bars 38, the sources 16, and the drains 18. A video signal is extracted on loading resistor $R_H$, which is connected to the bus-bars.

There is no direct amplification of the video signal in the present invention sensor device 10. In case of necessity, depending upon the application, an amplifier of current and/or voltage may be connected to the output of the scanning circuit. Such an amplifier would need to be adjusted to the output impedance of the sensor device. A share of the video output signal is transmitted to the input of the voltage power supply 46 by the feed-back circuit 44.

The sign and amplitude of the feed-back signal can be regulated by the feed-back circuit 44. Thus, there is a possibility to realize an automatic regime for the regulation of amplification (ARRA). Such a regime compensates for significant variations of light (radiation) intensity and thereby provides an average level of for video signal. The feed-back signal may be optimized for some definite parameters, such as for signal/noise ratio or for black radiation levels.

An extending regime can be set up for positive feed-back signals. Such a regime provokes sharp and large nonlinear increases in the level of the video signal for small increases in the intensity of the radiation. This is an additional source for extending the dynamic range of the output signal.

A trigger working regime can be set up at definite values of the positive feed-back signals. Such a regime provokes fast switching of the output video signal to either a low or high-potential state for small changes in radiation. Thus, in a result, a radiative equivalent of a Schmitt's trigger electronic circuit appears like a functional threshold scheme.

ACTION OF THE DEVICE

The sensitivity and the dynamic range of the present invention sensor device 10 are regulated by changing the voltage applied to the transparent electrode 34 and the conducting layer 28 and by the bias voltage of the field effect transistor structure itself. When a voltage pulse is applied to the sensor device 10 and when radiation is applied to the sensor device 10, an impulse voltage will appear at the output video signal. The magnitude of the impulse voltage is generally determined by the intensity of the radiation. This pulse regime of action for the sensor device 10 is much more convenient for electron treating, more defended against external interferences, and much more sensitive than a constant current regime. This pulse regime provides for maximal speed of action. The scanning time for measuring one pixel of a matrix of sensor devices 10 is comparable to a typical reacting time for TTL-devices (approximately 50 nsec.).

The time for raising and yielding a response from the sensor device 10 for one impulse of radiation is determined mostly by the properties of the photo-conducting material (i.e. the time for photo-generation and recombination and trapping/detrapping) and by the construction of the sensor device 10 itself.

The regime of accumulating charge and storage properties of the sensor device 10 is realized in the active medium 32. For the realization of this acting regime, the active medium 32 includes a dielectric layer and/or a ferro-electric layer. As previously mentioned, the first and second additional electrodes 24, 30 may also comprise ferro-electric material. When an electric field and radiation simultaneously appear in the active medium 32 a photo-electric state appears. The photo-electric state is a result of a local photo-generation due to the excitation of the layer of luminofore and the heterophase and/or homogenous structure of the photo-conducting layer.

In the active medium 32 a sufficiently stable change in the potential relief appears. This change depends on the intensity of the local radiation. This photo-electric state may be retained for a long time ($10^5$–$10^8$ sec.) depending on the characteristics of the components in the active medium 32.

The change of the potential relief may be read out by the scanning circuit without any kind of change in the active medium 32. In other words, the reading out process has no influence on the potential relief in the active medium 32. An erasing can be done by a certain dose of radiation as well as by an injection of non-equilibrium charge carriers from the transparent electrode 34 and the conducting layer 28. During such a process, all the deep trapping levels in the active medium 32 are filling up and the potential relief is equalizing.

It is important to keep in mind that the present invention sensor device 10 allows for all of the structural details of one X-ray sensitive sensor device according to the present invention to be contained within a 10 micron linear dimension. Such a sensor device 10 is useful in scanners and in high resolution opto-electronic systems in the UV-ray and X-ray ranges.

DEFINITIONS OF THE STRUCTURAL ELEMENTS AND THEIR INTERACTIONS

The layer of luminofore 36 transforms a part of incident short wave electro-magnetic radiation into visible light. Other parts of the radiation pass through the transparent electrode 34 into the active medium 32 where it is further transformed by the scintillator and/or by the luminofore included in the photo-conducting layer. A constant voltage and/or pulse voltage is applied to the multi-layer active medium 32. The active medium 32 is formed between the transparent electrode 34 and the second additional electrode 30. The external voltage power supply 46 is connected to the transparent electrode 34 and to the conducting layer 28. In the active medium 32, a non-homogeneous high gradient electrical field appears as a result of the low-conducting three-dimensional structure of the second additional electrode 30. Thus, a space distribution of both voltage potential and electrical current is created in the active medium 32.

A sharp and significant redistribution of the electrical potential in the active medium 32 is a result of photo-generation processes of the non-equilibrium current carriers in the photo-conducting layer. These photo-generation processes are going on inside the layer of luminofore 36 as well as in the luminofore and/or scintillator materials in the photo-conducting layer. This sharp and significant redistribution and change of the electrical potential is most active in the active medium 32 near the tip of the first additional electrode 24. The first additional electrode 24 transfers the change of the electrical potential to the gate 22 of the field-effect transistor. The change of the electrical potential of the gate 22 changes the conductivity of the channel 14 which is transferred to the exit of the sensor device 10 by bus-bars 38 connected to the source 16 and drain 18.

The active medium 32 has non-linear Volt-Ampere-Characteristics (VAC). This non-linearity is a result of a space current limited charge existing in the active medium 32 when an electrical field (voltage differential) is applied thereto. Thus, a small change in the applied voltage (V) corresponds to a significant change in the current (I): wherein n>>2. Thus, a small change in the number of charge carriers (both trapped and untrapped) corresponds to a significant change in the potential relief detected by first additional electrode 24.

DESCRIPTION OF THE EXPERIMENTS

The present invention sensor device 10 was tested in an experiment using discrete elements. The experiment was conducted using the following materials: 1.) a sensor device was made with a shielded up metal cylindrical body with an optic window having a 8 mm diameter, wherein the dimension of the working area was 2×2 mm; 2.) a light source was utilized with an optic bank, tungsten filament electric bulk with T=2570 K, wherein the light intensity was varied by an iris diaphragm and by a set of neutral filters; 3.) a lux-meter IL 1700 Research Radiometer by International Light Inc. was used to measure light intensity; 4.) a 10 V power supply was used for a generator; 5.) a FLUKE 343 A DC power supply was used to provide a voltage bias; 6.) a digital voltmeter 8200 A was used to measure output voltage; and 7.) an X-ray tube having a regulation for both accelerating voltage (10–50 kV) and for current (1–30 mA) was used as an X-ray source.

The sensor device had high sensitivity, so a neutral sandwich-like multilayer (multi-grid) metal wire filter having a weakness of 5000 times was used in all the X-ray experiments. The filter was located immediately in front of the sensitive surface of the sensor device.

In the X-ray experiments, the sensor device was isolated against all kinds of other radiative sources so as to exclude influences of interferences on the results.

Figure 5:
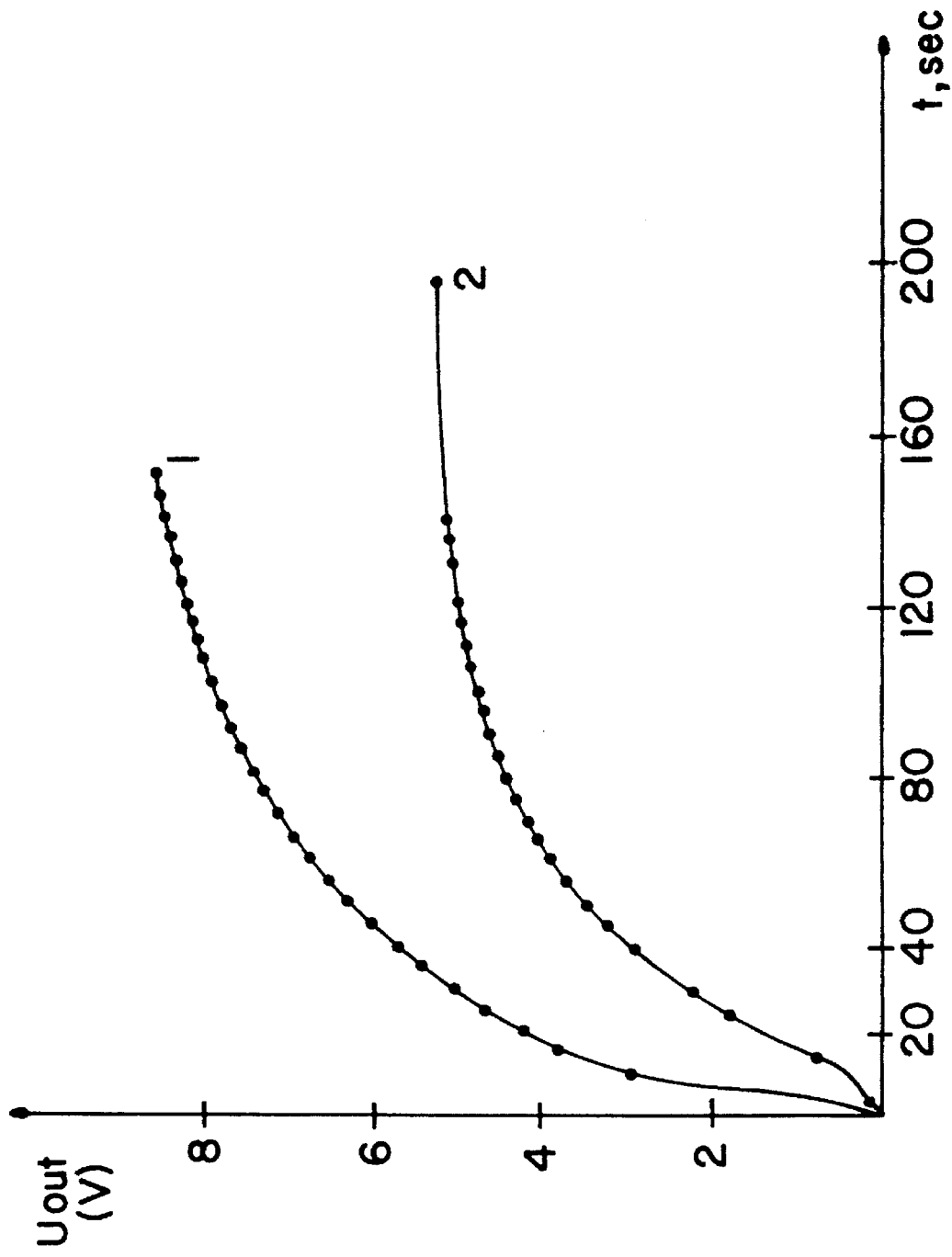
FIG. 5 is a graph showing the kinetics of the output voltage signal of a sensor device according to the present invention after applying X-ray radiation of two different magnitudes thereto.

The dependence of the video output signal ($U_{out}$) on the current of the X-ray tube (i.e. X-ray intensity) was almost linear (see FIG. 5 where line 1 corresponds to 50 kV, 10 mA and line 2 corresponds to 50 kV, 5 mA). This result was typical for the whole time the video output signal was increasing (up to reaching of steady state).

The process of charge accumulation on trapping levels and the formation of potential relief in the active medium 32 caused the long times for increasing the video output signal ($10^1$–$10^2$ sec.) at short photo-generation times (<$10^{-5}$ sec.).

Figure 6:
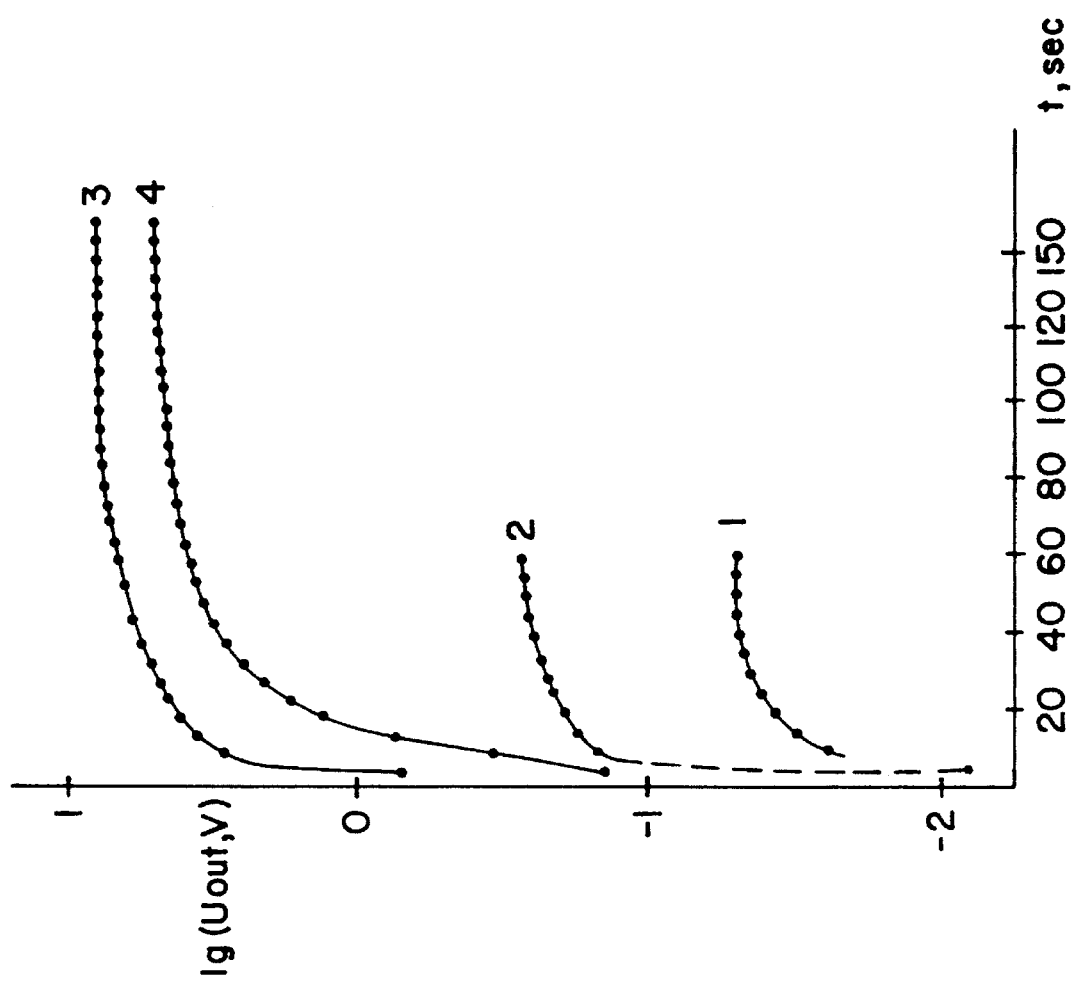
FIG. 6 is a graph showing the kinetics of the output voltage signal in semi-logarithmic scale of a sensor device according to the present invention after applying X-ray radiation of four different magnitudes thereto.

Increasing the accelerating voltage on the X-ray tube changes the energy spectrum of the X-ray radiation and increases the energy of the radiation while also penetrating the capacity of the X-ray. FIG. 6 shows the kinetics of the video output signal ($U_{out}$) for different power supply regimes of the X-ray tube (line 1 corresponds to 30 kV, 10 mA, line 2 corresponds to 40 kV, 10 mA, line 3 corresponds to 50 kV, 10 mA, and line 4 corresponds to 50 kV, 5 mA).

As can be seen from FIG. 6, increasing the accelerating voltage has a much stronger influence on the video output signal ($U_{out}$) than increasing the intensity of the X-ray (i.e. current of the X-ray tube). This situation is typical for all stages of increase of the video output signal, including those which are asymptotical. The reason for this is that the depth of the penetration of the X-ray radiation into the active medium is increased thereby creating a potential relief.

Figure 7:
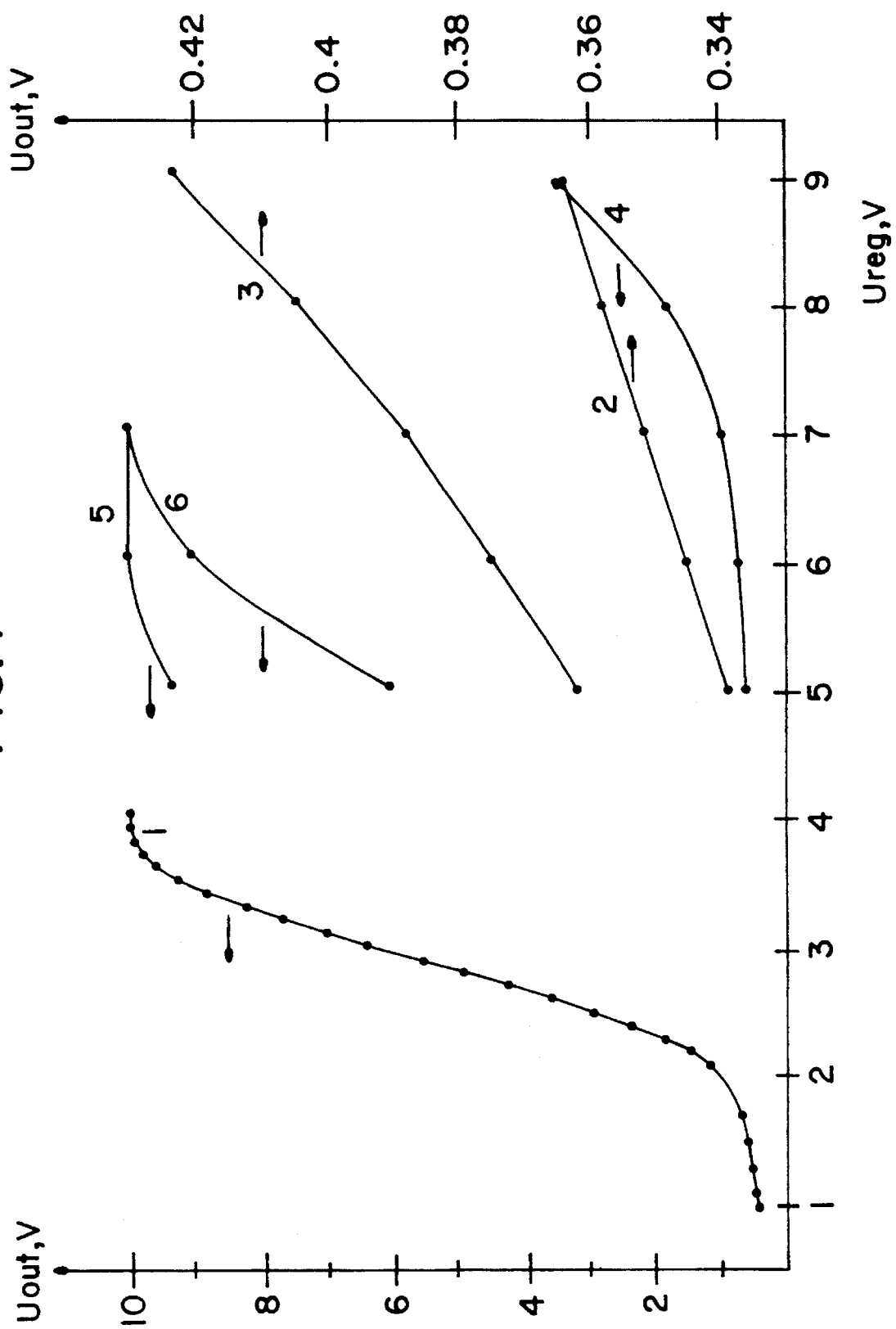
FIG. 7 is a graph showing the dependencies against power supply voltage of the output voltage signal of a sensor device according to the present invention after applying visible light of one magnitude and X-ray radiation of four different magnitudes thereto.
Figure 8:
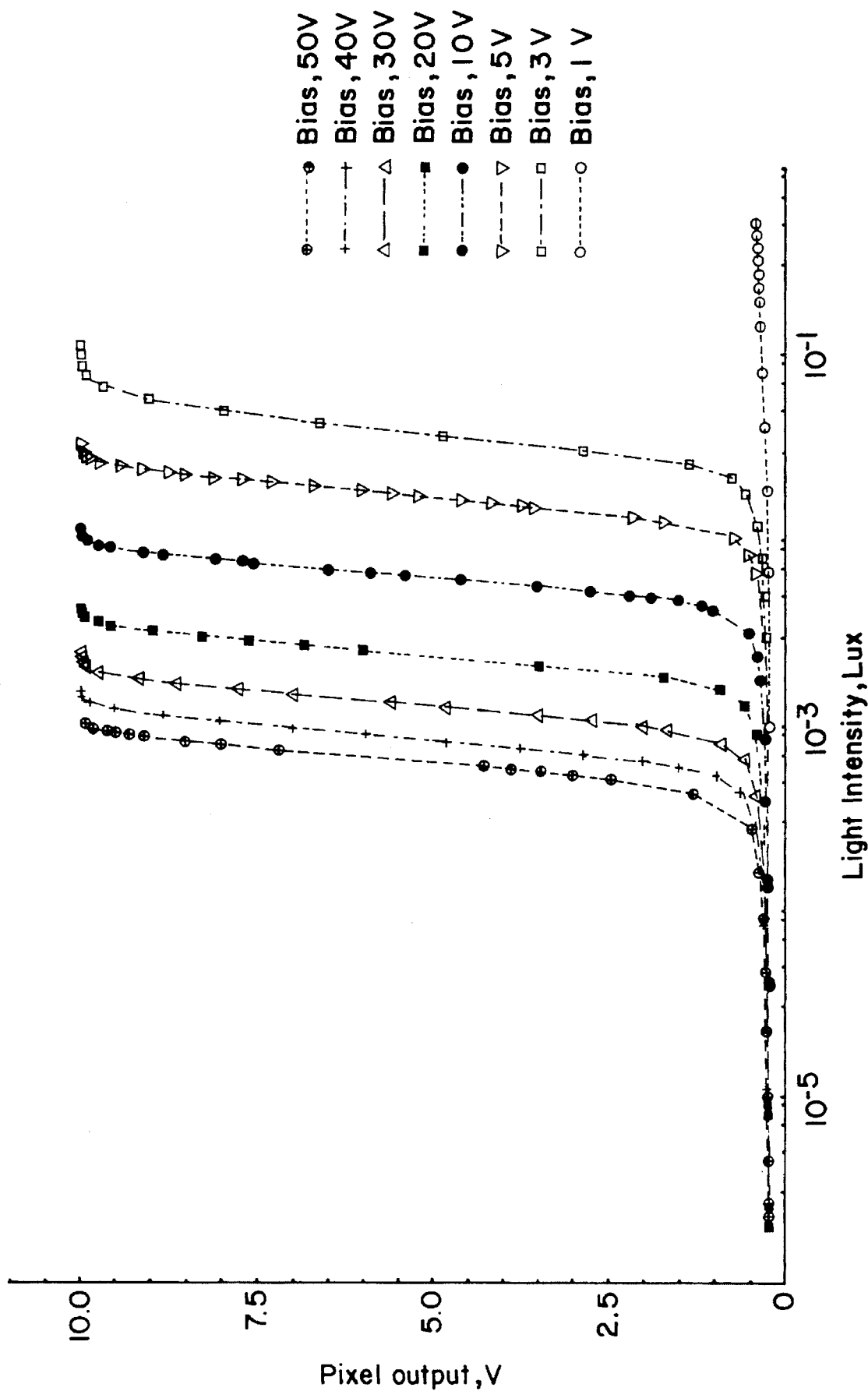
FIG. 8 is a graph showing in semilogarithmic scale the sensitivity to white light of a sensor device having an active medium thickness of 2 mm according to the present invention.
Figure 9:
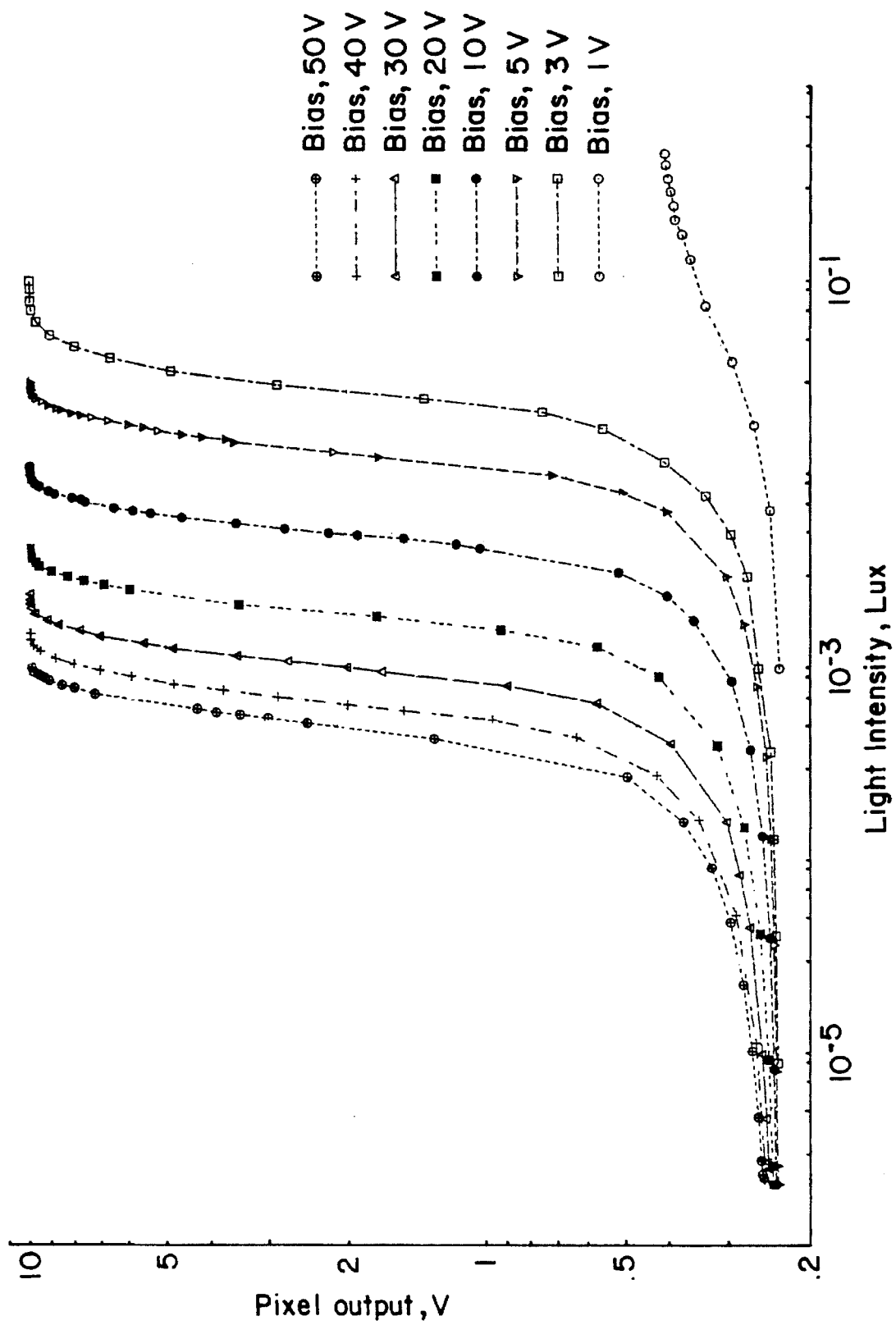
FIG. 9 is a graph showing in bilogarithmic scale the sensitivity to white light of a sensor device having an active medium thickness of 2 mm according to the present invention.
Figure 10:
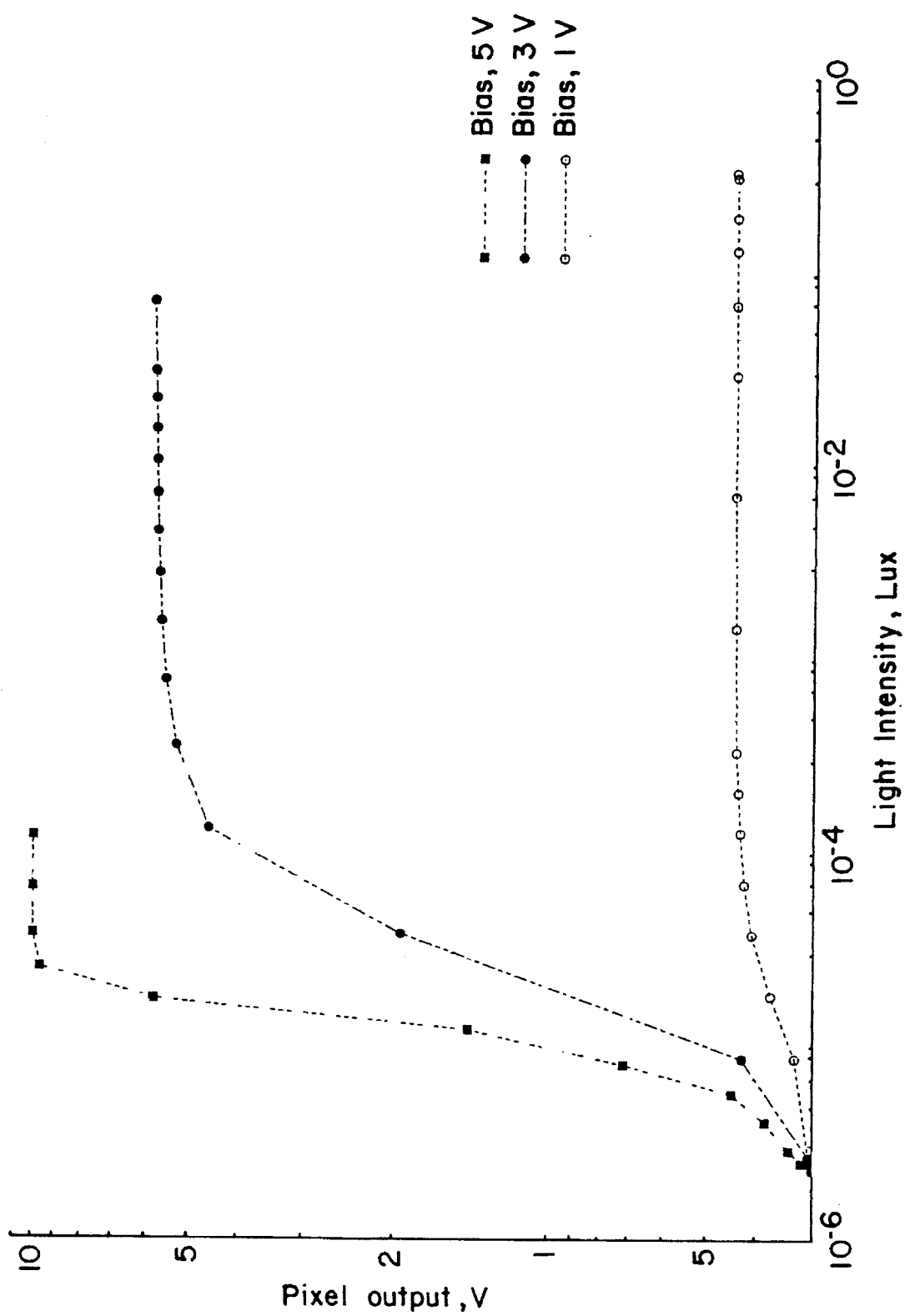
FIG. 10 is a graph showing in bilogarithmic scale the sensitivity to white light of a sensor device having an active medium thickness ranging from 100 µm to 200 µm according to the present invention.
Figure 11:
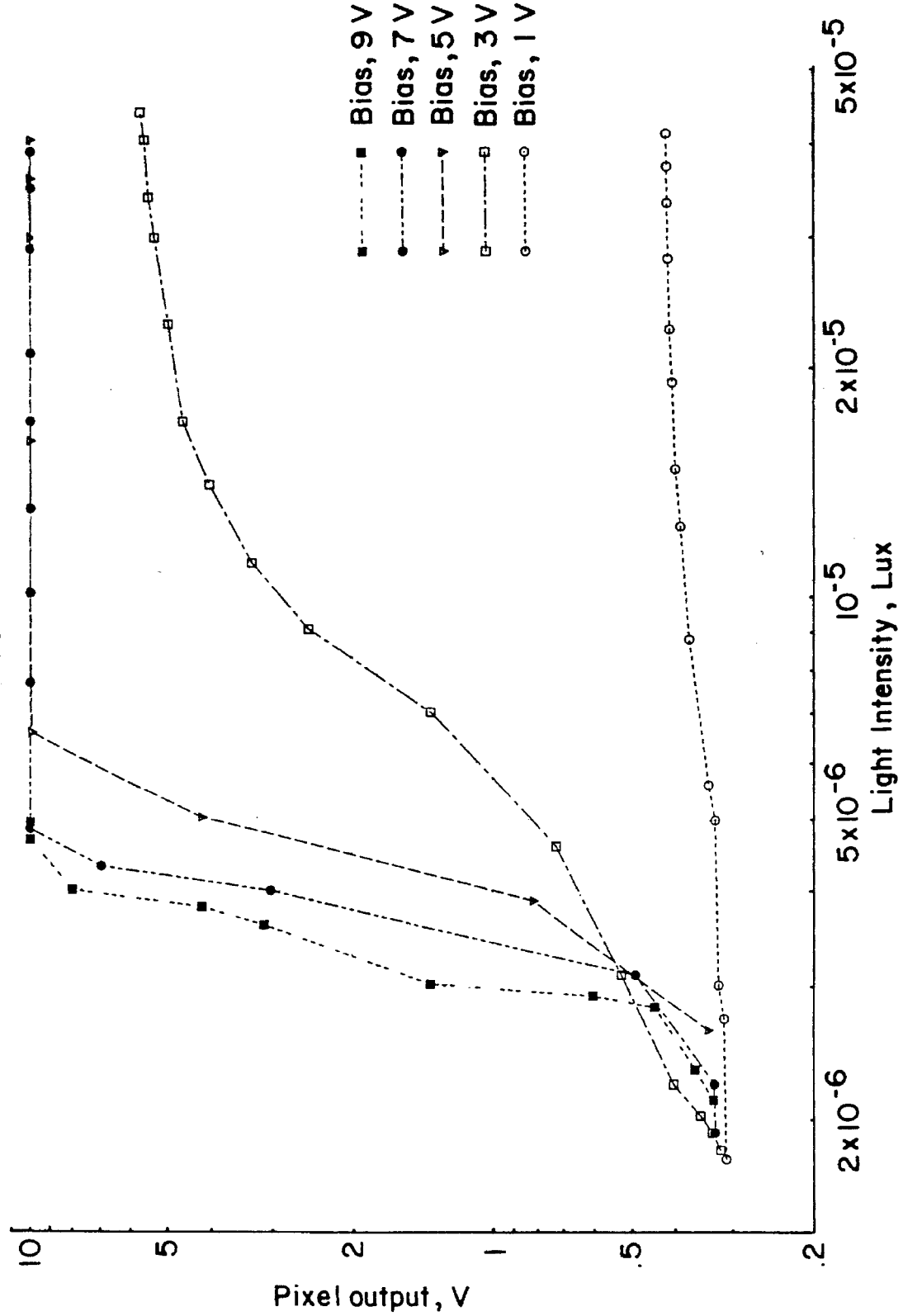
FIG. 11 is a graph showing in bilogarithmic scale the sensitivity to infrared light of a sensor device having an active medium thickness ranging from 100 µm to 200 µm according to the present invention.
Figure 12:
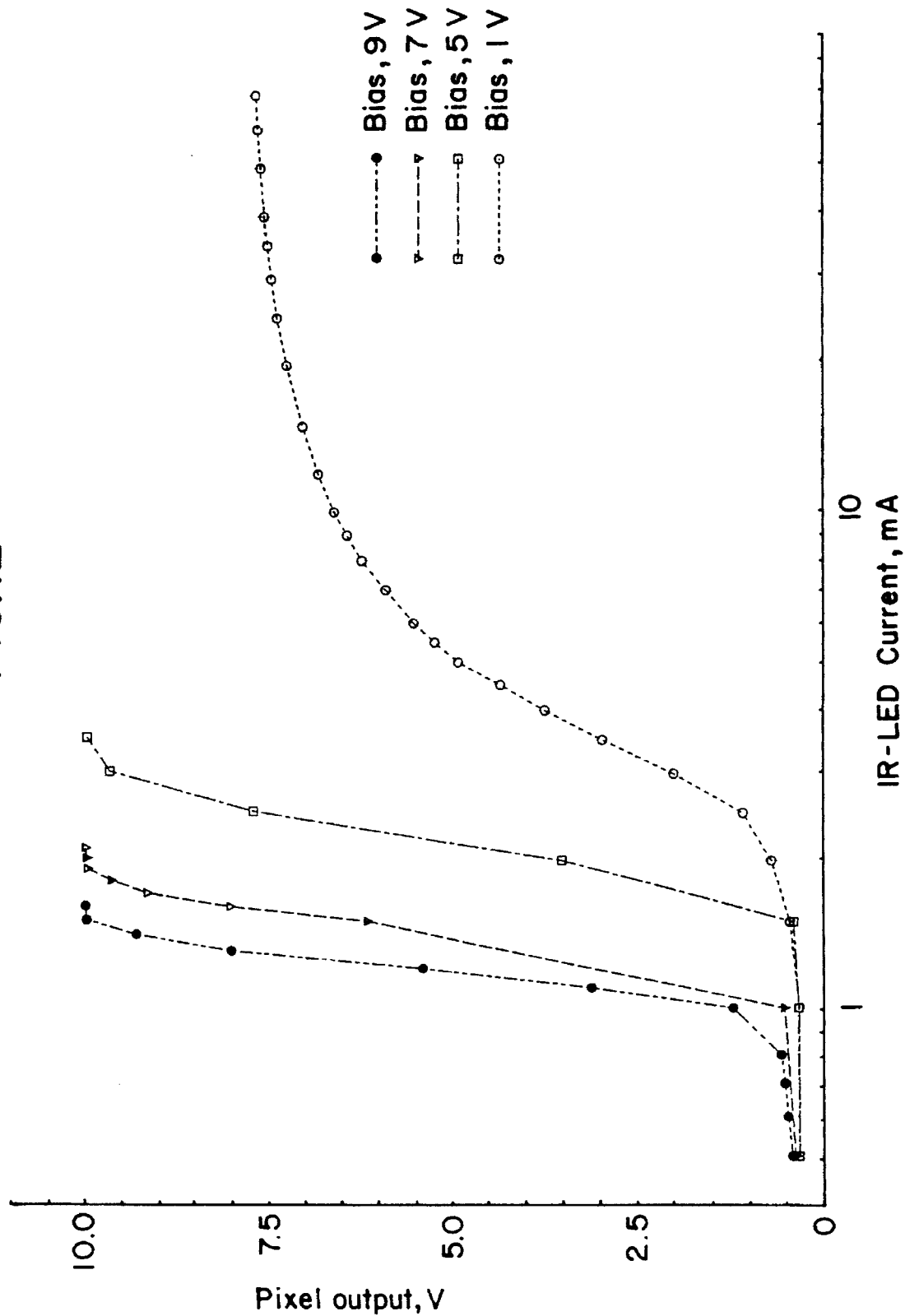
FIG. 12 is a graph showing in semilogarithmic scale the sensitivity to infrared light of a sensor device having an active medium thickness ranging from 100 µm to 200 µm according to the present invention.
Figure 13:
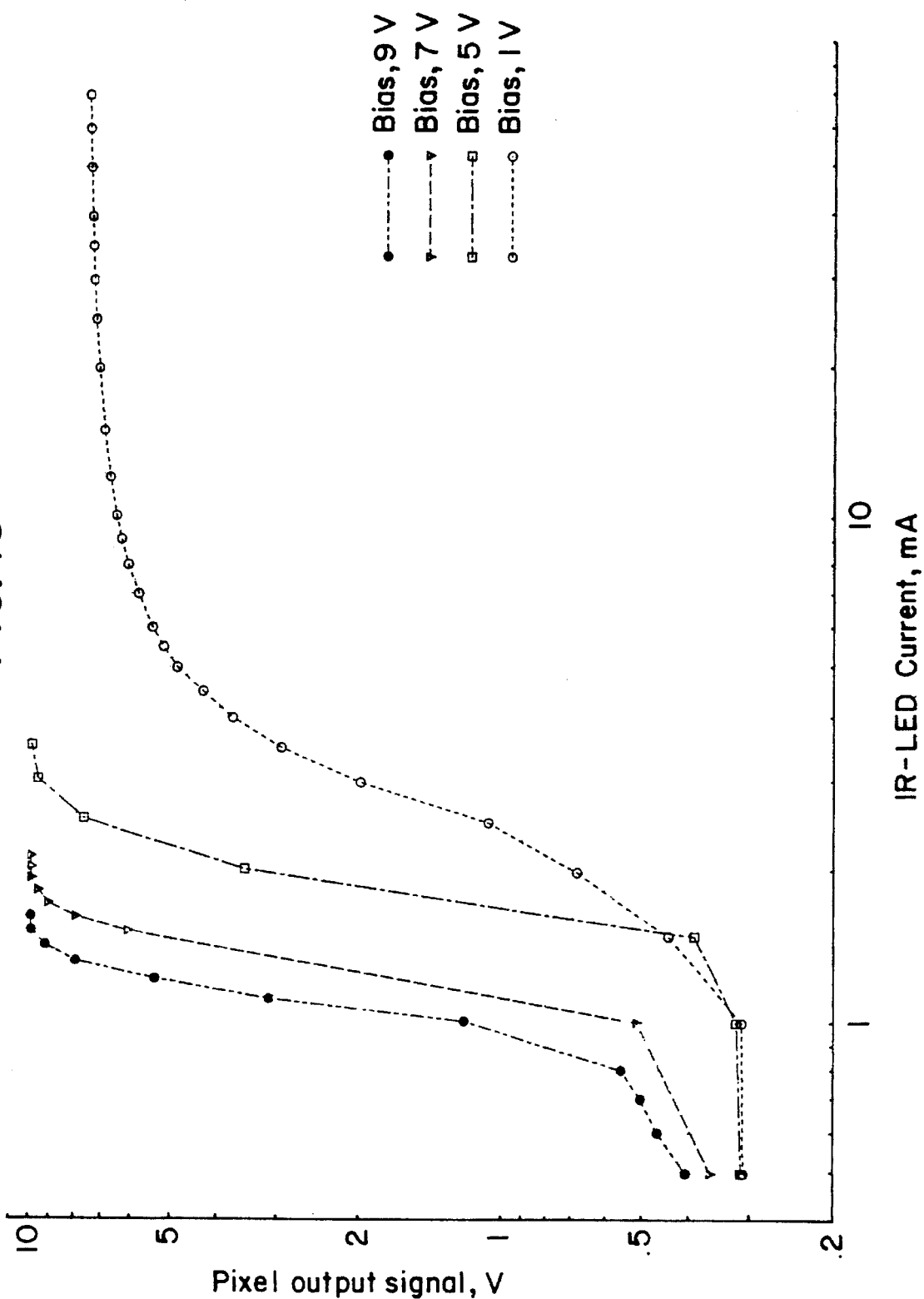
FIG. 13 is a graph showing in bilogarithmic scale the sensitivity to infrared light of a sensor device having an active medium thickness ranging from 100 µm to 200 µm according to the present invention.

Referring to FIG. 7, the dependencies of the video output signal ($U_{out}$) against the voltage bias power supply ($U_{reg}$) are shown. The character of the dependencies are similar for both white light (line 1) and for different X-ray power supply regimes (line 2 corresponds to 20 kV, 20 mA, line 3 corresponds to 30 kV, 10 mA, line 4 corresponds to 40 kV, 10 mA, line 5 corresponds to 50 kV, 10 mA, and line 6 corresponds to 50 kV, 5 mA). This similarity can be seen for the relatively high X-ray intensities (lines 4–6) as well as for the low X-ray intensities (lines 2,3) corresponding to the beginning part of the curve.

The curves presented in FIG. 7 demonstrate the capability of the present invention sensor device to receive electromagnetic radiation in realization of an effective electronic regulation by sensitivity and dynamic range over the whole electro-magnetic spectrum.

The present invention sensor device 10 was tested in a second experiment which measured the sensitivity of the sensor device 10 to white light and infrared radiation. This experiment was conducted by placing a sensor device 10 at a first end of a dark tube and a lux-meter at a second end of the dark tube. In the center of the dark tube there was placed both a tungsten lamp and an infrared LED. The lux-meter was an IL-1700 Reasearch Radiometer by International Light Inc. which has measuring capability at the low end of 1.0–1.5 $10_{-6}$ Lux. The infrared LED was capable of providing infrared radiation over the range of 950–1100 nanometers. Both light sources were connected at needed times to a precise power supply which was calibrated and controlled.

The sensitivity of the sensor device 10 was measured by applying a constant voltage (10 V) to the source of the sensor device and then measuring the conductivity through the channel of the sensor device at the drain of the sensor device. A voltage was applied across the active medium 32 from a separate power supply and was varied over the range from 1 to 50 Volts.

Actually, two different sensor devices 10 were measured. The first sensor device, pixel A, had an active medium thickness of 2.0 mm. The second sensor device, pixel B, had an active medium thickness ranging from 100–200 μm.

Figure 2:
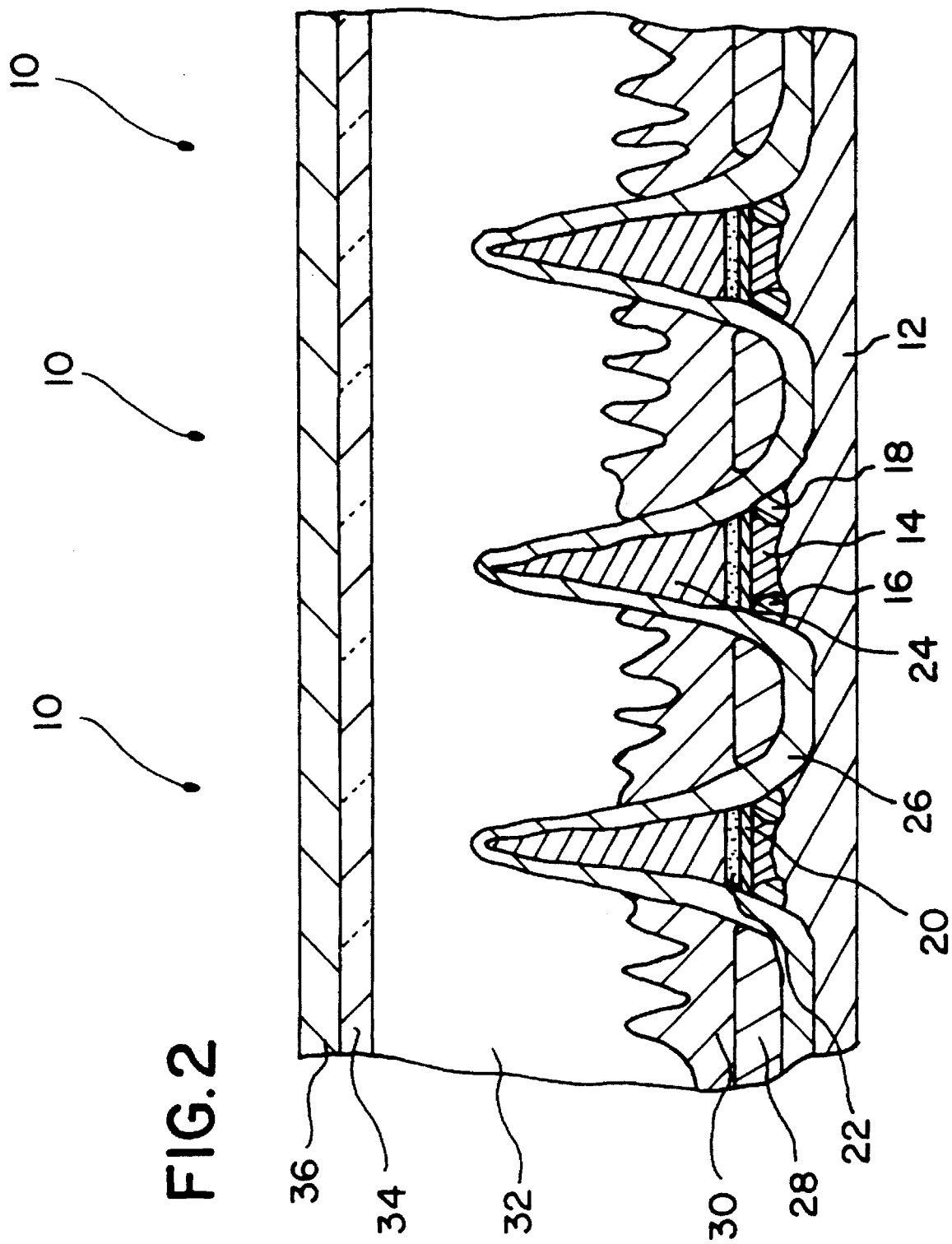
FIG. 2 is a cross-sectional view of a several sensor devices each having a dielectric layer completely covering a first additional electrode according to the present invention.

The experimental results are presented in FIGS. 8–13. FIGS. 1 and 2 present the characteristics of pixel A for varying intensities of white light at a few constant values of the voltages applied to the active medium. FIG. 1 is presented with semilogarithmic coordinates and FIG. 2 is presented with bilogarithmic coordinates.

Figure 3:
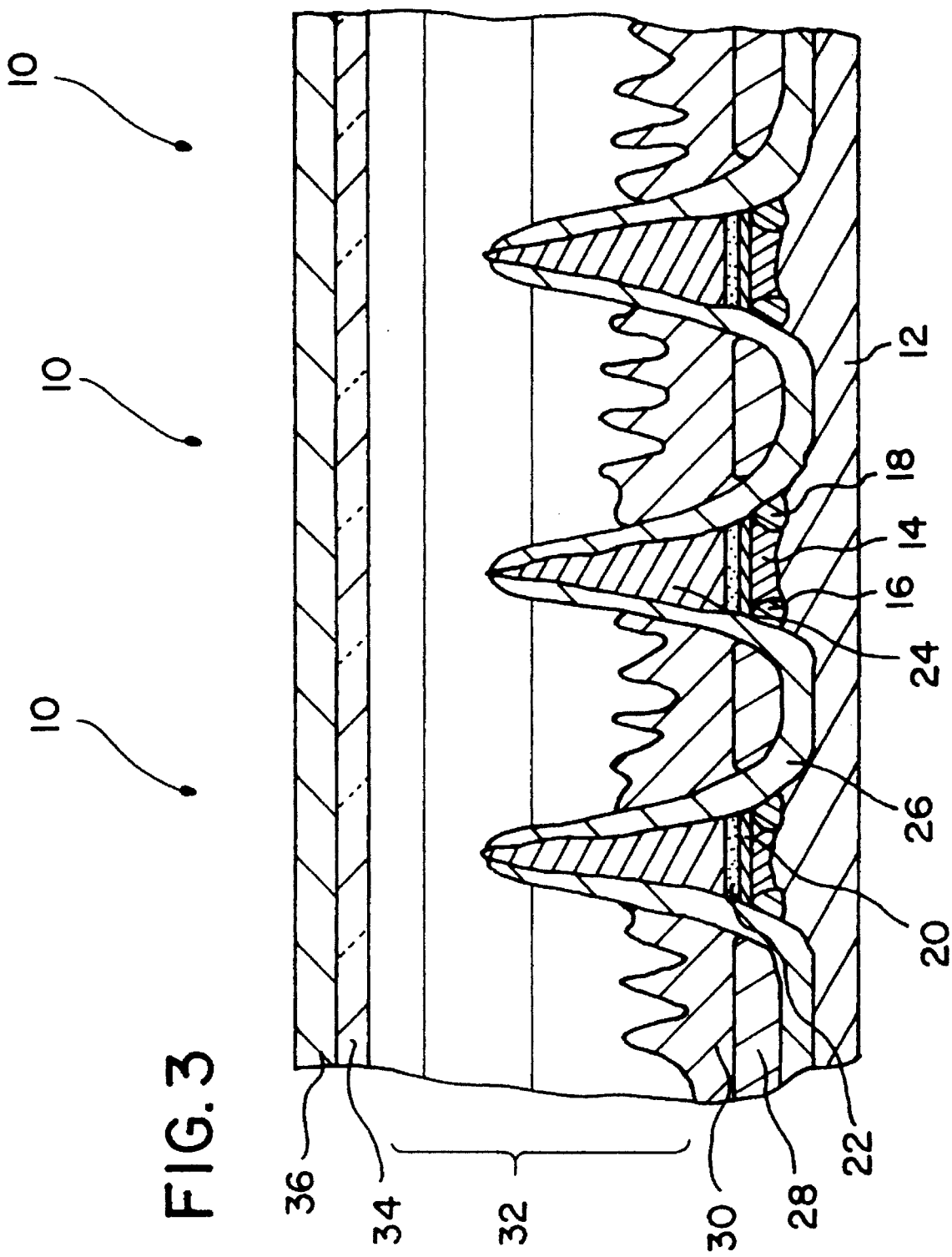
FIG. 3 is a cross-sectional view of a several sensor devices having multilayer active regions according to the present invention.

FIG. 3 presents the characteristics of pixel B with bilogarithmic coordinates for the varying intensity of white light at different voltage values applied to the active medium.

FIG. 4 presents the characteristics of pixel B for different intensities of infrared light at different voltage values applied to the active medium (the abscissa axis was presented with arbitrary units).

FIG. 5 presents in semilogarithmic coordinates the output signal of pixel B against the intensity of current exiting the infrared LED at different voltage values applied to the active medium. FIG. 6 corresponds to FIG. 5, but with bilogarithmic coordinates.

As can be readily seen, the characteristics for both pixels at different ranges of spectrum of electromagnetic radiation are similar. All of the figures show an area of slow rise (the area of low sensitivity), which transforms into an area having a sharp kind of rise at an increasing intensity of radiation. Moreover, as the voltage applied to the active medium is increased, the areas having a sharp kind of rise are shifted to the left, which indicates a response to a lower intensity of incident light.

Comparing the characteristics for pixels A and B (see FIGS. 2 and 3 for white light) drives us to realize how a small constructive difference between pixels A and B can lead to a significant change in the values of the voltage applied to the active medium and in the sensitivity to low intensities of incident light. Thus, for pixel A (FIG. 2, bias 50 Volts) the area of sharp rise of sensitivity is approximately $5 \times 10_{-4}$ lux, but for pixel B (FIG. 3, bias 5 Volts) the area of sharp rise corresponds to approximately $10_{-5}$ lux.

With the present invention sensor device 10 now fully described it can thus be seen that the primary objective set forth above is efficiently attained and, since certain changes may be made in the above described device 10 without departing from the scope of the invention, it is intended that all matter contained in the above description or shown in the accompanying drawings shall be interpreted as illustrative and not in a limiting sense.

What is claimed is:

1. A sensor device for storing electromagnetic radiation and for transforming electromagnetic radiation into electrical signals, said sensor device comprising:

a substrate;

a transistor formed on said substrate, said transistor having a source, a channel, a drain, a gate insulator, and a gate, said gate insulator being formed over said source, said channel, and said drain, said gate being formed over said gate insulator;

a first additional electrode formed over said gate;

a dielectric layer formed over said first additional electrode, said transistor, and said substrate;

a conducting layer formed over substantially all of said dielectric layer, said conducting layer having a first opening formed therein, the location of said first opening corresponding to the location of said first additional electrode, and hence said gate, beneath said dielectric layer;

a second additional electrode formed over substantially all of said conducting layer and said dielectric layer, said second additional electrode having a second opening formed therein, the location of said second opening corresponding to the location of said first additional electrode, and hence said gate, beneath said dielectric layer;

an active medium formed over said second additional electrode and said dielectric layer;

a transparent electrode formed over said active medium; and a layer of luminofore formed over said transparent electrode.

2. The device as defined in claim 1, wherein said first additional electrode has a narrowing vertical height dimension which results in an extension of said first additional electrode into said active medium.

3. The device as defined in claim 1, wherein said dielectric layer has an third opening formed therein, wherein the location of said third opening corresponds to an uppermost portion of said first additional electrode.

4. The device as defined in claim 1, wherein said second additional electrode has a variable vertical height dimension which results in a production of a non-homogeneous high gradient electrical field in said active medium.

5. The device as defined in claim 4, wherein said second additional electrode if formed with a low conducting material.

6. The device as defined in claim 1, wherein said active medium comprises a layer of photoconducting material.

7. The device as defined in claim 6, wherein said layer of photoconducting material is an organic photoconductor.

8. The device as defined in claim 6, wherein said layer of photoconducting material is an inorganic photoconductor.

9. The device as defined in claim 6, wherein said layer of photoconducting material is a piroelectric material.

10. The device as defined in claim 1, wherein said active medium comprises a plurality of layers, wherein at least one of said plurality of layers is a layer of photoconducting material.

11. The device as defined in claim 10, wherein said at least one layer of photoconducting material is an organic photoconductor.

12. The device as defined in claim 10, wherein said at least one layer of photoconducting material is an inorganic photoconductor.

13. The device as defined in claim 10, wherein said at least one layer of photoconducting material is a piroelectric material.

14. The device as defined in claim 10, wherein an additional one of said plurality of layers is a layer of ferroelectric material.

15. The device as defined in claim 10, wherein an additional one of said plurality of layers is a layer of dielectric material.

16. The device as defined in claim 1, further comprising a power supply connected to said transparent electrode and said conducting layer for generating an electric field in said active medium.

17. The device as defined in claim 16, further comprising bus-bars connected to said source and said drain of said transistor so as to provide output connections from said transistor.

18. The device as defined in claim 17, further comprising a scanning device connected to said bus-bars so as to provide an output signal indicative of the conductivity of said channel.

19. The device as defined in claim 18, further comprising a feed-back circuit responsive to said output signal for providing a feed-back signal to said power supply.

* * * * *